United States Patent
Kozono

(10) Patent No.: US 6,496,016 B1
(45) Date of Patent: Dec. 17, 2002

(54) SEMICONDUCTOR DEVICE FOR USE IN EVALUATING INTEGRATED CIRCUIT DEVICE

(75) Inventor: Hiroyuki Kozono, Kawasaki (JP)

(73) Assignee: Kabushiki Kaisha Toshiba, Kawaski (JP)

( * ) Notice: Subject to any disclaimer, the term of this patent is extended or adjusted under 35 U.S.C. 154(b) by 0 days.

(21) Appl. No.: 09/716,468

(22) Filed: Nov. 21, 2000

(30) Foreign Application Priority Data

Nov. 22, 1999 (JP) .......................................... 11-331700

(51) Int. Cl.[7] .............................................. H01H 31/02
(52) U.S. Cl. ...................................................... 324/555
(58) Field of Search ................................. 324/537, 555, 324/757, 765; 73/763, 768, 804, 805; 438/14, 15, 17, 18

(56) References Cited

U.S. PATENT DOCUMENTS

| 4,232,554 A | * | 11/1980 | Aleck | ........................... 73/577 |
|---|---|---|---|---|
| 4,684,884 A | * | 8/1987 | Soderlund | ................. 324/73 R |
| 5,129,443 A | * | 7/1992 | Yano et al. | ................... 164/4.1 |
| 5,673,028 A | * | 9/1997 | Levy | ........................... 340/635 |
| 5,896,081 A | * | 4/1999 | Tzeng et al. | ............... 338/22 R |
| 5,907,274 A | * | 5/1999 | Kimura et al. | ............... 338/309 |
| 5,917,311 A | * | 6/1999 | Brokaw | ....................... 323/280 |
| 5,939,641 A | * | 8/1999 | Lotfi et al. | ...................... 73/768 |
| 6,052,287 A | * | 4/2000 | Palmer et al. | .............. 361/767 |
| 6,141,093 A | * | 11/2000 | Argyle et al. | ............. 356/237.1 |
| 6,339,321 B1 | * | 1/2002 | Yamashita et al. | ........ 324/158.1 |

* cited by examiner

*Primary Examiner*—N. Le
*Assistant Examiner*—Etienne P. LeRoux
(74) *Attorney, Agent, or Firm*—Finnegan, Henderson, Farabow, Garrett & Dunner, L.L.P.

(57) ABSTRACT

In an evaluation tool for use in evaluating an LSI, a piezo-diffusion-resistor unit and a temperature monitor unit are disposed close to each other in a first layer, for example, near a corner area and a central area on an Si substrate. A polysilicon resistor array is disposed on that area of the Si substrate which excludes locations where the piezo-diffusion-resistor unit and temperature monitor unit are disposed. Over these elements, an Al wiring layer, or a second layer, is provided with an interlayer insulation film interposed. Thus, the evaluation tool is provided with a stepped structure which is substantially similar to a structure of an actual LSI product.

4 Claims, 4 Drawing Sheets

SEMICONDUCTOR DEVICE FOR USE IN EVALUATING INTEGRATED CIRCUIT DEVICE

CROSS-REFERENCE TO RELATED APPLICATIONS

This application is based upon and claims the benefit of priority from the prior Japanese Patent Application No. 11-331700, filed Nov. 22, 1999, the entire contents of which are incorporated herein by reference.

BACKGROUND OF THE INVENTION

The present invention relates to a semiconductor device for use in evaluating an integrated circuit device. More particularly, this invention relates to an evaluation tool for evaluating initial characteristics and reliability of an LSI (Large Scale Integrated Circuit).

Recently, the integration density of LSIs has been increased more and more. On the other hand, the possibility of occurrence of a passivation crack or Al slide in the LSI has become higher. It is known that such drawbacks occur due to a thermal stress (shearing stress) resulting from a temperature variations in a resin-sealed package. In general, the thermal stress applied to the resin-sealed package increases as the wiring becomes finer or the chip becomes larger in size.

The passivation crack is a factor of deterioration in the humidity resistance of the resin-sealed package. In particular, in the case of a product with double-layer AL wiring, a crack occurring in an interlayer insulation film deteriorates insulation between wiring layers. Depending on a pattern design (layout), an Al slide may cause inter-wire short or break of wire.

A method using TEG (TEST Element Group) is known as a prior-art method for diagnosing occurrence of defects such as passivation cracks or Al slide. This method was made public in the "19th Symposium of Reliability and Maintenance" of the Science and Technology Association (June 1989). According to this method, a TEG, in which a plurality of Al wire elements having varying widths in a range of 1 μm to 90 μm are two-dimensionally arranged, is assembled on a resin-sealed package. With this structure, the surface of a chip is observed before and after a thermal stress is applied to the chip in a thermal shock test, etc. Thereby, a region on the chip, where a passivation crack or Al slide has occurred, is quantatively evaluated.

There is known another method wherein a stress within a package is measured using a stress measuring element in which diffused resistance layer patterns (unit cells) with different piezoresistance coefficients are two-differentially arranged.

In the TEG or the stress measuring element, however, the Al wire elements are resistance layer patterns are arranged only two-dimensionally. Thus, their structures are greatly different from the structure of products with double-layer Al wiring. Therefore, neither of the above-described prior-art methods is suitable for finally evaluating products. In the prior art, for this reason, it is imperative to evaluate actual products one by one.

BRIEF SUMMARY OF THE INVENTION

The object of the present invention is to provide an evaluation tool (a semiconductor device for use in evaluating integrated circuit devices) capable of quantatively and precisely evaluating the initial characteristics and reliability of LSIs, and dispensing with evaluation using actual products.

In order to achieve this object, there is provided an evaluation tool comprising: a stress sensor, a temperature sensor and a resistor group which are all disposed on a semiconductor substrate; and a wiring layer provided on the stress sensor, the temperature sensor and the resistor group, with an insulation film interposed.

According to this invention, there is also provided an evaluation tool comprising: a semiconductor substrate; a stress sensor disposed at each of at least two locations including a central area and a corner area of the semiconductor substrate; a temperature sensor disposed close to the stress sensor at each of at least two locations including the central area and the corner area of the semiconductor substrate; a resistor group disposed in an array fashion on the semiconductor substrate excluding the locations where the stress sensor and the temperature sensor are provided; and a wiring layer provided on the stress sensor, the temperature sensor and the resistor group, with an insulation film interposed, the wiring layer being divided into a plurality of areas with different line widths ranging from several μm to several-hundred μm.

According to the evaluation tool of the present invention, defects which may actually occur in LSIs can be reproduced with higher fidelity. Thus, evaluation with a structure substantially equal to the structure of an actual product can be made.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 1:
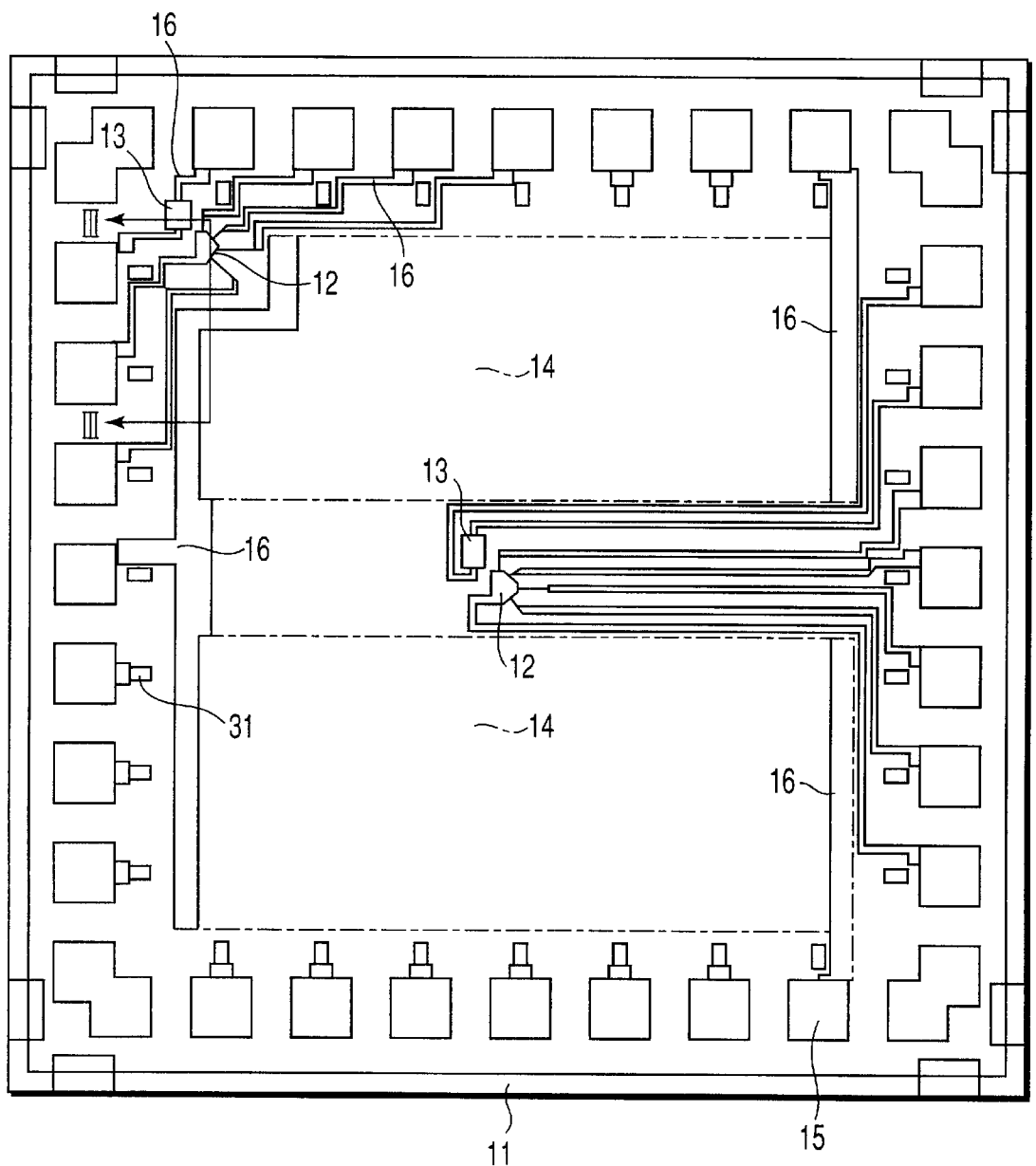
FIG. 1 is a plan view showing a main part of the structure of an evaluation tool according to an embodiment of the present invention.
Figure 2:
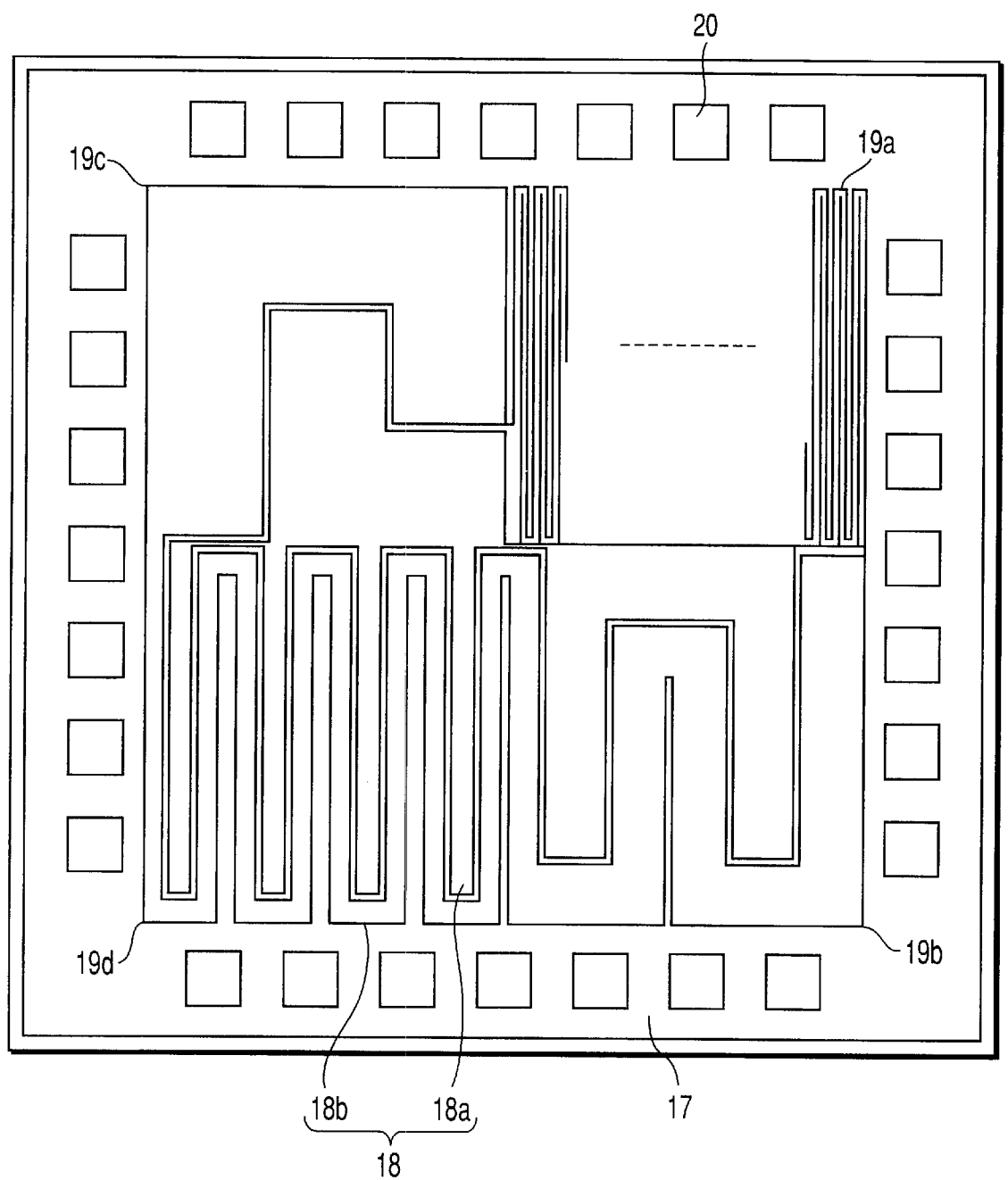
FIG. 2 is a plan view showing a main part of the structure of the evaluation tool shown in FIG. 2.
Figure 3:
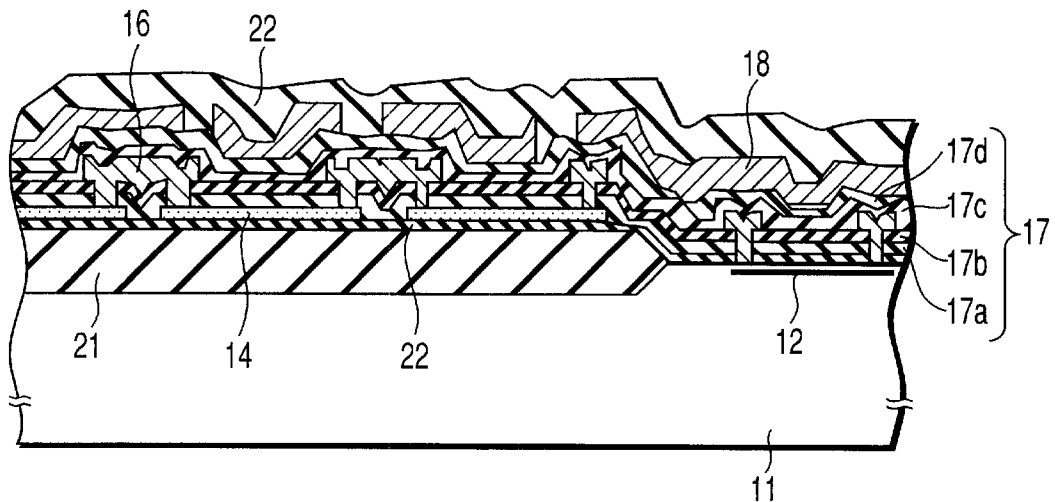
FIG. 3 is a cross-sectional view showing the main part of the structure of the evaluation tool shown in FIGS. 1 and 2.

FIGS. 1 to 3 show the structure of an evaluation tool for LSIs according to a first embodiment of the present invention. FIG. 1 is a plan view of a unit layer (lower layer) of the evaluation tool, FIG. 2 is a plan view of a wiring layer (upper layer) of the evaluation tool, and FIG. 3 is a cross-sectional view taken along line III—III in FIG. 1.

As is shown in FIG. 1, for example, the unit layer (lower layer) of this evaluation tool has a piezo-diffusion-resistor unit (stress sensor) 12 and a temperature monitor unit (temperature sensor) 13 disposed near each of a corner portion and a central portion on an Si substrate 11. The Si substrate 11 has substantially the same size as an actual LSI to be evaluated (hereinafter referred to as "product"). The piezo-diffusion-resistor unit 12 and temperature monitor unit 13 are disposed close to each other. Thereby, measurement of a stress/heat distribution of the product can substantially be effected.

A polysilicon resistor array (resistor group) 14 serving as a heater is disposed on that area of the Si substrate 11, which excludes the piezo-diffusion-resistor units 12 and temperature monitor units 13. The polysilicon resistor array 14 comprises a plurality of polysilicon resistors which are connected in series and in parallel (i.e. in an array fashion) such that the value of DC current in the substrate may become uniform. The polysilicon resistor array 14 is divided into a plurality of blocks (two blocks in FIG. 1). Each block can be driven independently. Where an exothermic area of the product is limited, only at least one of the blocks of the polysilicon resistor array 14 may be driven. Thereby, evaluation of a thermal defect of the product can substantially be effected.

The polysilicon resistor array 14 is formed to have a height (i.e. a difference in level between recess portions and projecting portions) of, about 2000 Å to 3000 Å. Thereby, a structure substantially equal to a stepped structure of a product can be realized in the evaluation tool.

In addition, a plurality of electrode pads 15 are provided on a peripheral portion of the Si substrate 11. Each electrode pad 15 is connected via first Al wiring (1Al) 16 to the piezo-diffusion-resistance unit 12, the temperature monitor unit 13, the polysilicon resistance array 14, and upper-layer Al wiring (to be described later). The layout (size, number, etc.) of the electrode pads 15 on the Si substrate 11 is the same as that of electrode pads of the product.

On the other hand, an interlayer insulation film 17, as shown in FIG. 2, for example, is provided over the above-described unit layer (comprising the piezo-diffusion-resistance unit 12, the temperature monitor unit 13, the polysilicon resistance array 14, etc.). A wiring layer (upper layer) 18 comprising second Al wiring (2Al) is formed on the interlayer insulation film 17.

The wiring layer 18 has different line widths ranging from several $\mu$m to several-hundred $\mu$m in divided areas, for example, four-division areas 19a to 19d, respectively. In this case, the wiring layer 18 is formed with a line width of 2 $\mu$m in the area 19a, 120 $\mu$m in the area 19b, 240 $\mu$m in the area 19c, and 40 $\mu$m in the area 19d. In each of the areas 19a to 19b the wiring layer 18 is composed of comb-shaped wiring 18a and snake-shaped wiring 18b which are combined as desired. Normally, the LSI has symmetry. Thus, with this structure, plural different line widths can be evaluated at a time by a single evaluation tool.

It is desirable that the respective line widths of the wiring layer 18 should have such dimensions as are actually adopted in the product and can surely prevent wiring defects in a fabrication process of the evaluation tool.

A peripheral portion of the interlayer insulation film 17 has widows for exposing the electrode pads 15.

In FIG. 3, reference numerals 21 and 22 are silicon oxide ($SiO_2$) films. The interlayer insulation films 17 comprises an $SiO_2$ film 17a, a silicon nitride (SiN) film 17b, an $SiO_2$ film 17c, and an SiN film 17d. An uppermost layer, or a protection film (e.g. polyimide film) 23, is provided over the entirety of the Si substrate 11 including the wiring layer 18, thereby protecting the surface of the evaluation tool.

According to this structure, the evaluation tool can have the same stepped structure as the product having double-layer Al wiring. Accordingly, the evaluation tool can reproduce, with high fidelity, defects such as passivation cracks or Al slide which will occur in the product. Similarly, thermal defects, which will occur at the time of operation of the product, can substantially be evaluated by the heater (polysilicon resistor array 14) and temperature monitor unit 13.

Moreover, the size of the evaluation tool, which is an important parameter of evaluation, can be increased in units of 1 mm in a range of 1 mm to 15 mm in each side of the square shape of the evaluation tool. Thereby, the valuation tool can evaluate products of various sizes. In particular, where a plurality of evaluation tools of the same size are fabricated from a single Si wafer (1 wafer/1 chip size), fabrication steps following a dicing step can be simplified. Since the 1 chip size is adopted, the function of a fabrication step monitor can be provided.

Furthermore, as shown in FIG. 1, the wiring layer 18 and electrode pads 15 may be connected via load-connection polysilicon resistors 31 and the 1Al 116. With this structure, it can be easily determined whether a defect has occurred in the wiring layer 18 which is inside the electrode pads 15 or it has occurred outside the electrode pads 15.

As has been described above, a defect which will actually occur in the LSI can be reproduced with high fidelity. Specifically, the evaluation tool has a double-layer structure wherein the Al wiring layer is provided over the layer including the piezo-diffusion-resistor unit, temperature monitor unit and polysilicon resistor array. Thereby, the stepped structure is formed, and the structure substantially equal to the structure of the product with the double-layer Al wiring can be obtained. Accordingly, defects due to mechanical stress, heat radiation, humidity resistance and thermal stress in the equivalent structure of the product can substantially be diagnosed. Therefore, evaluation of each of products is not necessary, and quantitative evaluation of initial characteristics and reliability of each LSI can be effected.

(Second Embodiment)

Figure 4:
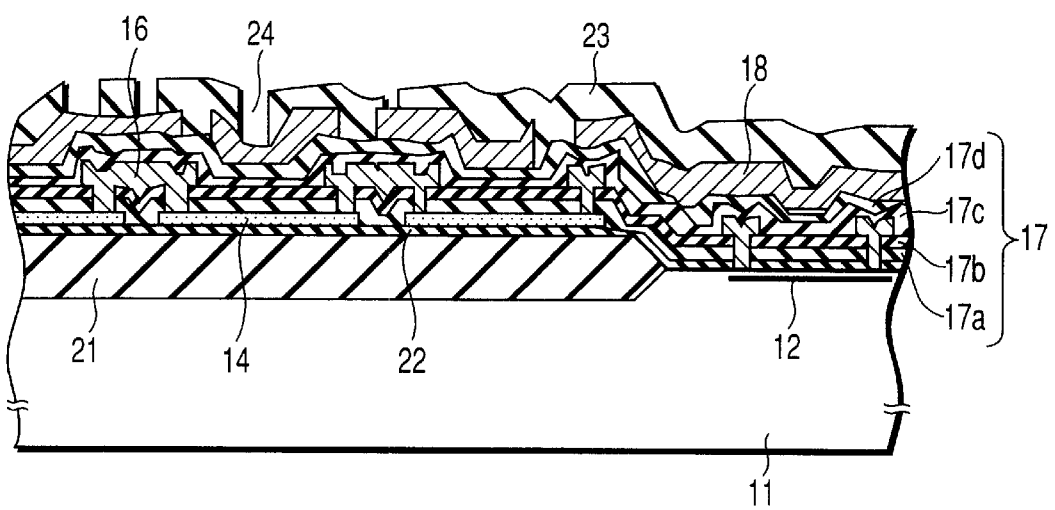
FIG. 4 is a cross-sectional view showing a main part of the structure of an evaluation tool according to a second embodiment of the present invention.

FIG. 4 shows the structure of an evaluation tool according to a second embodiment of the present invention. The structural elements common to those in FIG. 3 are denoted by like reference numerals, and a detailed description thereof is omitted.

In the second embodiment, in addition to the structure of the first embodiment, openings 24 reaching the wiring layer 18 are formed in the uppermost protection film 23. In particular, the openings 24 are formed with a higher density at corner portions of the substrate. With this structure, sensitivity to humidity resistance can be enhanced. Specifically, an Al corrosion, which is a defect occurring when the LSI absorbs humidity, is electrically evaluated by intentionally cutting the wiring layer 18. Since the openings 24 are formed in the uppermost protection film 23 on the wiring layer 18, entering of moisture in the evaluation tool is accelerated. Thereby, the sensitivity of evaluation for humidity resistance is enhanced. Thus, the time and the number of tools needed for evaluation can be reduced.

In each of the above-described embodiments, the pair of piezo-diffusion-resistor unit and temperature monitor unit is disposed only at each of the central area and corner area of the substrate. It is preferable, however, to provide such pairs at least two locations including the central area and corner area of the substrate.

Figure 5:
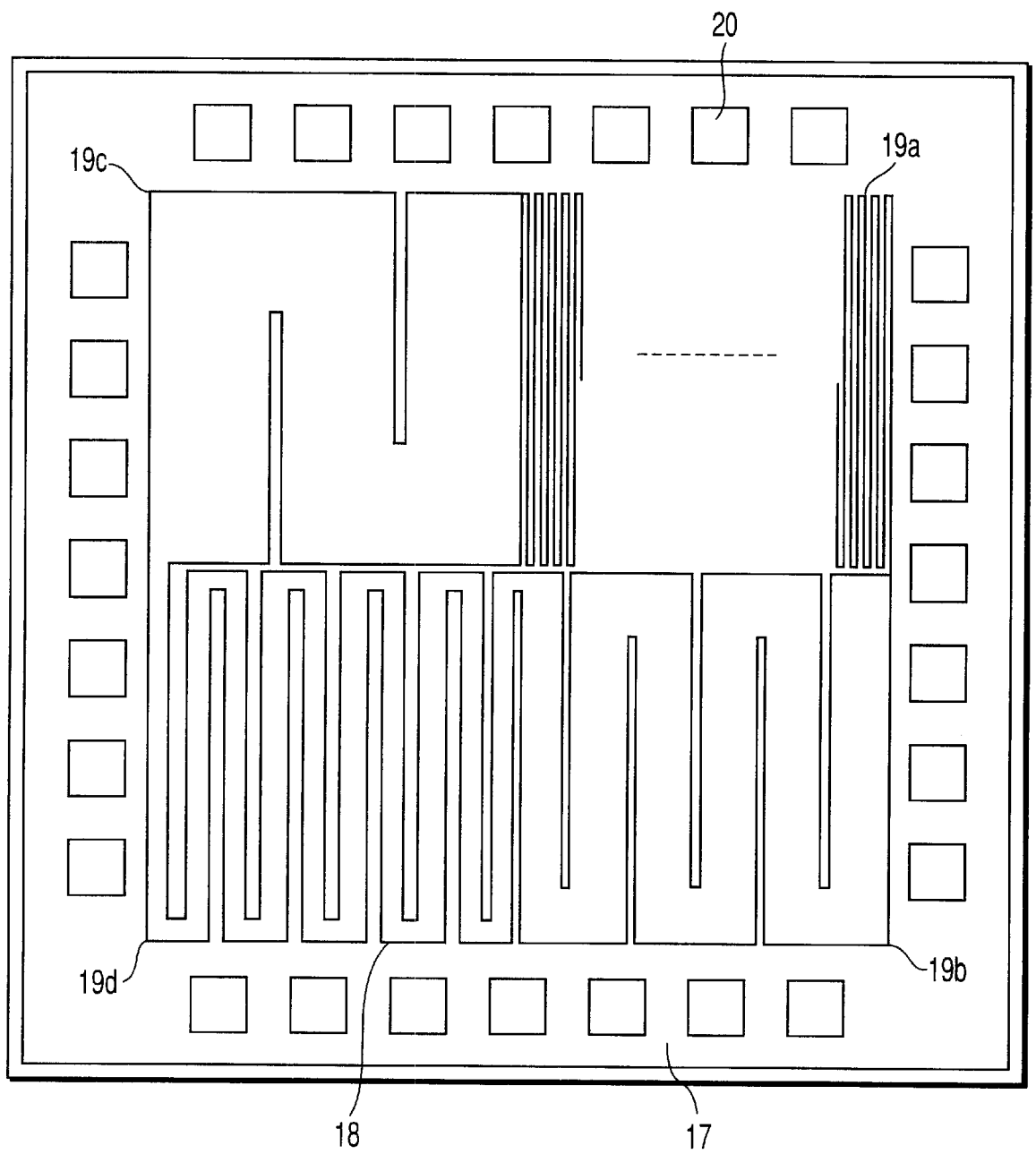
FIG. 5 is a plan view showing another example of the main part of the structure of the evaluation tool, which corresponds to the structure shown in FIG. 2.

In the structure shown in FIG. 2, in each of the areas 19a to 19d, the wiring layer 18 is composed of comb-shaped wiring 18a and snake-shaped wiring 18b which are combined. However, this invention is not limited to this structure. For example, as shown in FIG. 5, the wiring layer 18 in each of the areas 19a to 19d may be composed of snake-shaped wiring alone.

As has been described above in detail, the present invention can provide an evaluation tool capable of quantatively and precisely evaluating the initial characteristics and reliability of LSIs, and dispensing with evaluation using actual products.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An evaluation tool for use in evaluating an integrated circuit device having double-layer wiring, comprising:

a semiconductor substrate having almost the same size as the integrated circuit device to be evaluated;

a pressure sensor provided in at least two locations including a central area and a corner area of the semiconductor substrate;

a temperature sensor provided in at least two locations including the central area and the corner area of the semiconductor substrate, and close to the pressure sensor;

a resistor group in which a plurality of resistance elements are disposed in an array fashion on the substrate excluding locations where the pressure sensor and the temperature sensor are provided, the resistor group being formed to have a height of about 2000 to 3000 Angstroms, the resistor group being divided into a plurality of blocks, and the respective blocks being formed so that power can be independently supplied to each of the blocks;

a wiring layer provided on an upper layer of the pressure sensor, the temperature sensor and the resistor group, with an insulation film interposed, the wiring layer being divided into a plurality of areas, the respective areas being formed to have different line widths ranging from several $\mu$m to several hundred $\mu$m; and a protection film formed to cover the wiring layer.

2. An evaluation tool according to claim 1, wherein the wiring layer is formed in a zigzag shape.

3. An evaluation tool according to claim 1, wherein the wiring layer is formed of a combination of comb-shaped wiring and zigzagged wiring.

4. An evaluation tool according to claim 1, wherein the protection film provides openings reaching the wiring layer.

* * * * *